(12) United States Patent
Singh et al.

(10) Patent No.: US 11,462,648 B2
(45) Date of Patent: Oct. 4, 2022

(54) FIN-BASED SCHOTTKY DIODE FOR INTEGRATED CIRCUIT (IC) PRODUCTS AND METHODS OF MAKING SUCH A SCHOTTKY DIODE

(71) Applicant: GLOBALFOUNDRIES U.S. Inc., Santa Clara, CA (US)

(72) Inventors: Jagar Singh, Clifton Park, NY (US); Srikanth Balaji Samavedam, Cohoes, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 5 days.

(21) Appl. No.: 16/704,002

(22) Filed: Dec. 5, 2019

(65) Prior Publication Data
US 2021/0175370 A1  Jun. 10, 2021

(51) Int. Cl.
*H01L 29/87* (2006.01)
*H01L 29/66* (2006.01)
*H01L 29/872* (2006.01)

(52) U.S. Cl.
CPC .... *H01L 29/8725* (2013.01); *H01L 29/66143* (2013.01)

(58) Field of Classification Search
CPC .......... H01L 29/8725; H01L 29/66143; H01L 29/66212; H01L 29/872; H01L 51/0579; H01L 2924/12032; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211
See application file for complete search history.

(56) References Cited

U.S. PATENT DOCUMENTS

| 6,426,541 | B2 | 7/2002 | Chang et al. |
| 7,939,905 | B2 | 5/2011 | Nagai |
| 8,018,021 | B2 | 9/2011 | Kim et al. |
| 9,793,262 | B1 * | 10/2017 | Punchihewa ......... H01L 29/861 |
| 2008/0211020 | A1 | 9/2008 | Saito |
| 2009/0294865 | A1 | 12/2009 | Tang et al. |
| 2013/0062723 | A1 | 3/2013 | Henning et al. |
| 2017/0186654 | A1 * | 6/2017 | Li ................... H01L 21/823871 |
| 2019/0006351 | A1 * | 1/2019 | Zhou ................ H01L 21/02532 |
| 2020/0286889 | A1 * | 9/2020 | Salcedo ............. H01L 27/0262 |

* cited by examiner

*Primary Examiner* — Moin M Rahman
*Assistant Examiner* — Mohammad A Rahman
(74) *Attorney, Agent, or Firm* — Francois Pagette; Hoffman Warnick LLC

(57) ABSTRACT

One illustrative Schottky diode disclosed herein includes a semiconductor substrate, an anode region and a cathode region. The anode region includes a plurality of first fins with a first vertical height formed in the anode region, wherein an upper surface of the semiconductor substrate is exposed within the anode region. The cathode region includes a plurality of second fins with a second vertical height that is greater than the first vertical height. The device also includes a conductive structure that contacts and engages at least an upper surface of the plurality of first fins in the anode region.

17 Claims, 11 Drawing Sheets

FIN-BASED SCHOTTKY DIODE FOR INTEGRATED CIRCUIT (IC) PRODUCTS AND METHODS OF MAKING SUCH A SCHOTTKY DIODE

BACKGROUND

Field of the Invention

The present disclosure generally relates to various novel embodiments of a fin-based Schottky diode for an integrated circuit (IC) product and various novel methods of making such a Schottky diode.

Description of the Related Art

A Schottky diode (sometimes referred to as a hot-carrier diode) is a semiconductor diode formed by the junction of a semiconductor material with a metal. Relative to standard silicon diodes, a Schottky diode has a very low forward voltage drop and a very fast switching action, characteristics that result in better system efficiencies in IC products using Schottky diodes. Schottky diodes are used in a wide variety of applications. For example, Schottky diodes may be employed in voltage clamping applications, in photovoltaic systems to prevent batteries from discharging through solar panels at night, in rectifiers in switched-mode power supplies and in diode-bridge based sample and hold circuits, etc. However, manufacturing Schottky diodes based upon FinFET technology and techniques has been problematic.

The present disclosure is generally directed to various novel embodiments of a fin-based Schottky diode for an IC product and various novel methods of making such a Schottky diode.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel embodiments of a fin-based Schottky diode for an IC product and various novel methods of making such a Schottky diode. One illustrative Schottky diode disclosed herein includes a semiconductor substrate, an anode region and a cathode region. The anode region includes a plurality of first fins with a first vertical height formed in the anode region, wherein an upper surface of the semiconductor substrate is exposed within the anode region. The cathode region includes a plurality of second fins with a second vertical height that is greater than the first vertical height. The device also includes a conductive structure that contacts and engages at least an upper surface of the plurality of first fins in the anode region.

Another illustrative Schottky diode disclosed herein includes a semiconductor substrate, an anode region and a cathode region. The anode region includes a plurality of first fins with a first vertical height and a first upper surface, wherein an upper surface of the semiconductor substrate is exposed within the anode region. The cathode region includes a plurality of second fins with a second vertical height and a second upper surface, wherein the second vertical height is greater than the first vertical height and wherein a lateral width of the first upper surface is greater than a lateral width of the second upper surface. The device also includes a substrate contact region comprising a plurality of third fins formed in the semiconductor substrate, an inner doped well region in the semiconductor substrate below the anode region and the cathode region, wherein the inner doped well region comprises dopant material of a first type, and a counter-doped outer well region in the substrate below the substrate contact region and around the inner doped well region, wherein the counter-doped outer well region comprises dopant material of a second type that is opposite the first type. The device also includes a conductive structure that conductively contacts at least an upper surface of the plurality of first fins in the anode region.

One illustrative method for forming a Schottky diode includes forming a plurality of first fins in a semiconductor substrate in the anode region, forming a plurality of second fins in the semiconductor substrate in the cathode region, wherein the plurality of first fins and the plurality of second fins have substantially the same first vertical height, and forming at least one layer of insulating material above the plurality of first fins and the plurality of second fins and above the semiconductor substrate. In this example, the method also includes performing at least one etching process to remove the at least one layer of insulating material in the anode region and to recess the plurality of first fins, wherein the etching process exposes an upper surface of the semiconductor substrate within the anode region and wherein the recessed plurality of first fins have a recessed height that is less than the first vertical height of the plurality of second fins, and forming a conductive structure that contacts and engages at least an upper surface of the recessed plurality of first fins in the anode region.

BRIEF DESCRIPTION OF THE DRAWINGS

The disclosure may be understood by reference to the following description taken in conjunction with the accompanying drawings, in which like reference numerals identify like elements, and in which.

Figure 1:
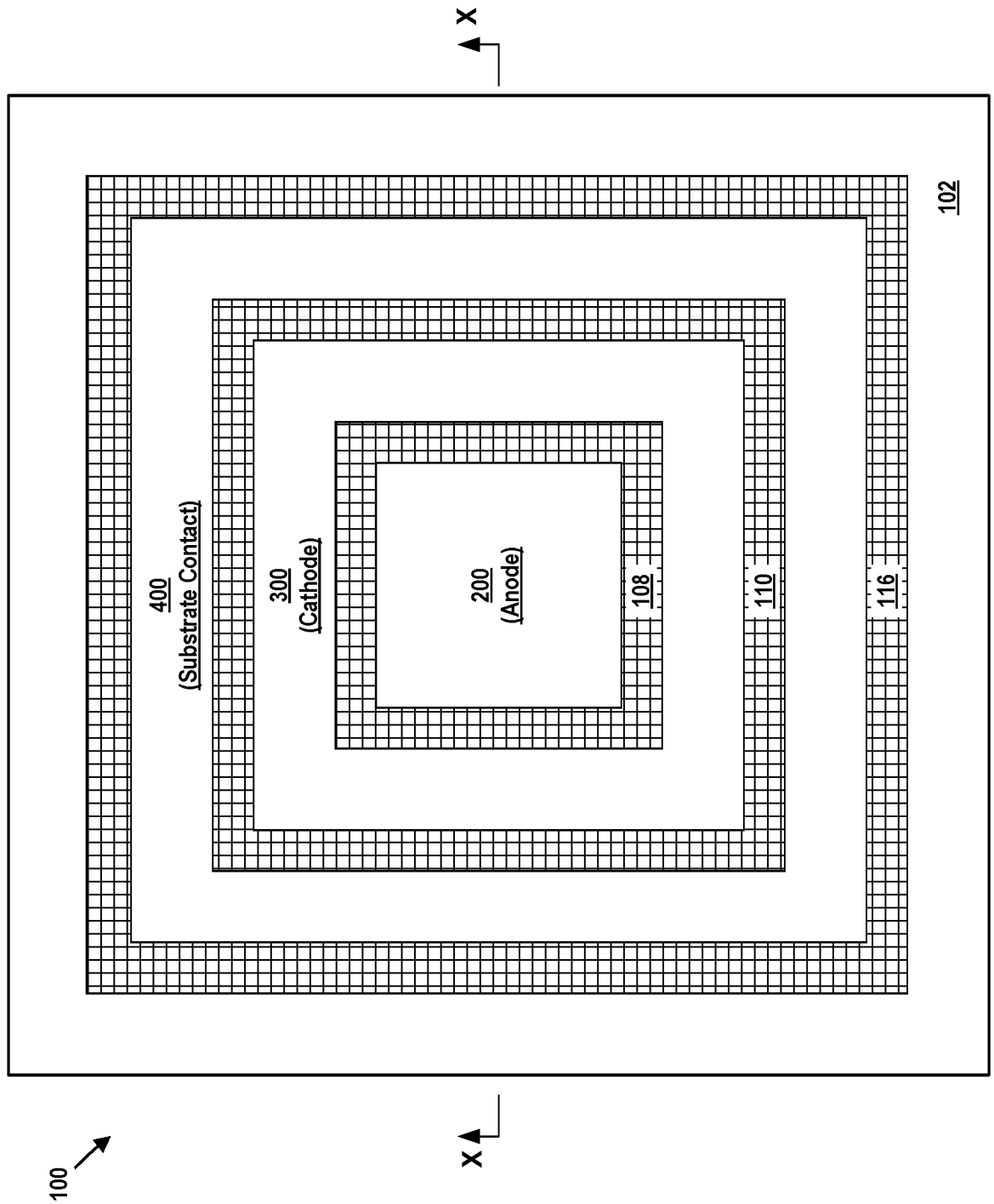
FIGS. 1-11 depict various novel embodiments of a fin-based Schottky diode for an IC product and various novel methods of making such a Schottky diode.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. However, as noted above, the various inventions disclosed herein should not be considered to be limited to the particular examples shown in the attached drawings and described below.

FIGS. 1-11 depict various novel embodiments of a fin-based Schottky diode 100 and various novel methods of making such a Schottky diode 100. FIG. 1 is a plan view of one illustrative embodiment of a Schottky diode 100 disclosed herein. The Schottky diode 100 may be formed on a semiconductor substrate 102. The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

With reference to FIG. 1, the Schottky diode 100 generally comprises an anode region 200, a cathode region 300 and a substrate contact region 400. Also depicted in FIG. 1 are a plurality of ring-like isolation structures 108, 110 and 116, e.g., shallow trench isolation (STI) structures that are formed in the substrate 102. In the depicted example, the isolation structure 108 isolates the anode region 200 from the cathode region 300, the isolation structure 110 isolates the cathode region 300 from the substrate contact region 400 and the isolation structure 116 isolates the substrate contact region 400 from other devices (not shown) that are formed on the substrate 102. The physical size, e.g., area and configuration (when viewed from above), of the anode region 200, the cathode region 300, the substrate contact region 400 and the isolation structures 108, 110 and 116 may vary depending upon the particular application. In the example shown in FIG. 1, the anode region 200 is depicted as having a substantially square configuration but that may not be the case in all applications.

The attached drawings include various cross-sectional views of the illustrative embodiment of the Schottky diode 100 disclosed herein. FIG. 1 depicts the location where the cross-sectional view ("X-X") of the Schottky diode 100 shown in some of the attached drawings is taken. The isolation structure 116 is not depicted in the cross-sectional views so as to simplify the drawings. The drawings are not to scale.

Figure 2:
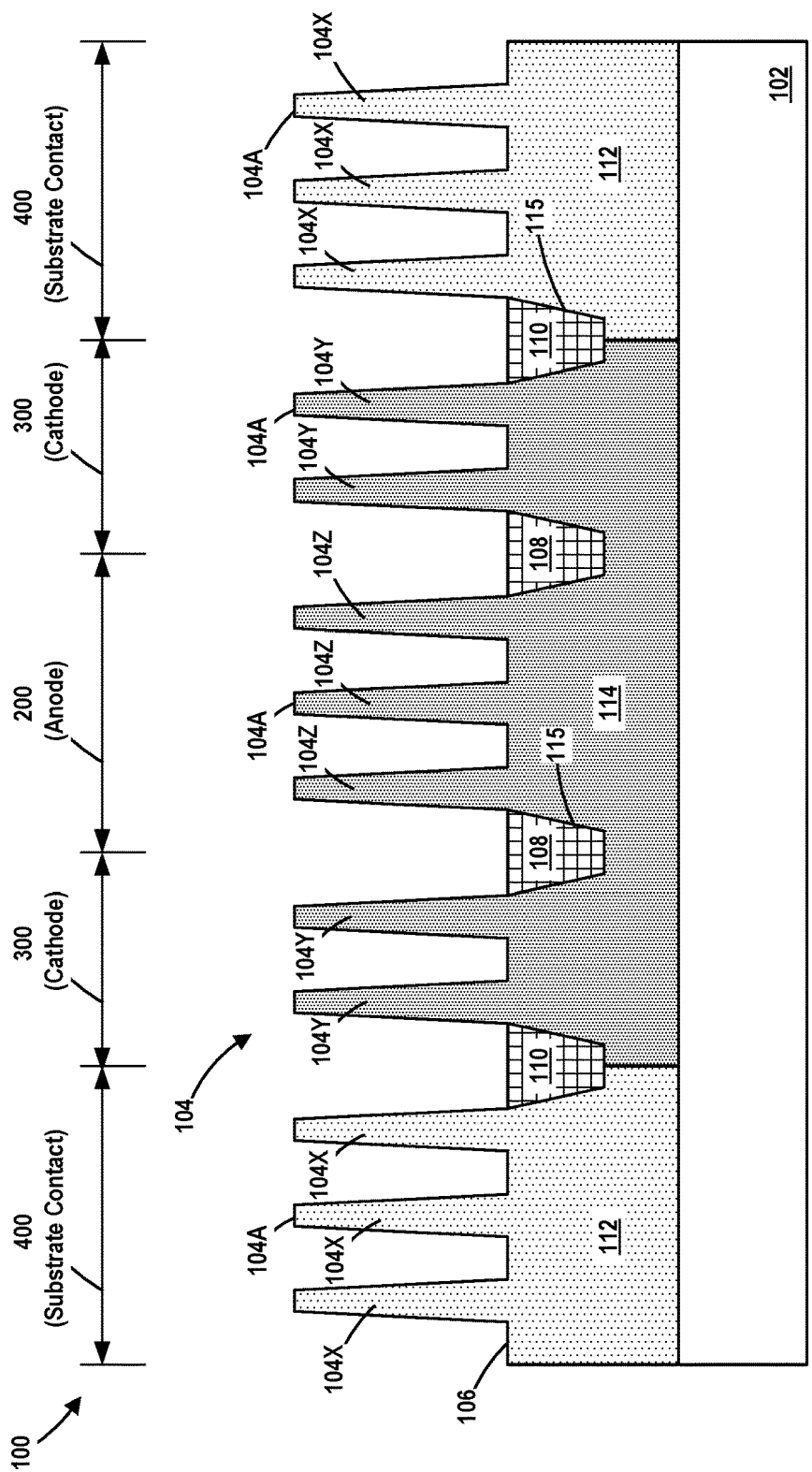

In one illustrative process flow, as shown in FIG. 2, the formation of the Schottky diode 100 begins with the formation of an inner well region 114 and a counter-doped outer well region 112 in the substrate 102 by performing traditional masking and ion implantation processes known to those skilled in the art. The dopant concentration, location of peak dopant concentration and the overall vertical depth of the inner well region 114 and the counter-doped outer well region 112 may all vary depending upon the particular application.

As will be appreciated by those skilled in the art after a complete reading of the present application, the Schottky diodes disclosed herein may be an N-type device or a P-type device. An IC product may contain both N-type and P-type Schottky diodes 100. In the case where the Schottky diode 100 is an N-type device, the substrate 102 may be doped with a P-type dopant (e.g., boron, boron difluoride, etc.), the inner well region 114 will be doped with an N-type dopant (e.g., arsenic, phosphorous, etc.), and the counter-doped outer well region 112 will be doped with a P-type dopant (e.g., boron, boron difluoride, etc.). Note that the counter-doped outer well region 112 is counter-doped with respect to the inner well region 114. However, the counter-doped outer well region 112 is doped with the same dopant type (in this example P-type) as that of the substrate 102. Additionally, the inner well region 114 is counter-doped with respect to the doping of the substrate 102. In some cases, the basic semiconductor substrate 102 may be very lightly doped (e.g., 1e12 atoms/cm$^2$) prior to the formation of the inner well region 114 and the counter-doped outer well region 112 therein. In the case where the Schottky diode 100 is a P-type device, the dopants used in the various regions would be opposite to that described above. More specifically, when the Schottky diode 100 is a P-type device the substrate 102 may be doped with an N-type dopant (e.g., arsenic, phosphorous, etc.), the inner well region 114 will be doped with a P-type dopant (e.g., boron, boron difluoride, etc.) and the counter-doped outer well region 112 will be doped with an N-type dopant (e.g., arsenic, phosphorous, etc.).

With continued reference to FIG. 2, after the inner well region 114 and the counter-doped outer well region 112 were formed in the substrate 102, a plurality of fins 104X, 104Y and 104Z (collectively referenced using the numeral 104) were formed in the substrate 102 by performing known masking and etching techniques. More specifically, the fins 104 were formed in the substrate 102 by performing one or more etching processes, e.g., anisotropic etching processes, through a patterned fin-formation etch mask (not shown) to form a plurality of fin-formation trenches 106 in the substrate 102 and thereby define the plurality of fins 104. At this point in the process flow, each of the fins 104 has an upper surface 104A. The fins 104 may be formed with any desired fin pitch, and the fin pitch in each of the anode region 200, the cathode region 300, and the substrate contact region 400 may or may not be the same. The fins 104 may be formed with any desired vertical height.

In the example shown in the simplistic cross-sectional views herein, the anode region 200 comprises three illustrative fins 104Z, the cathode region 300 comprises four illustrative fins 104Y, and the substrate contact region 400 comprises six illustrative fins 104X. Of course, in practice, each of the anode region 200, the cathode region 300, and the substrate contact region 400 may comprise any number of fins 104 and the number of fins 104 in each of the anode region 200, the cathode region 300 and the substrate contact region 400 may be different.

Figure 3:
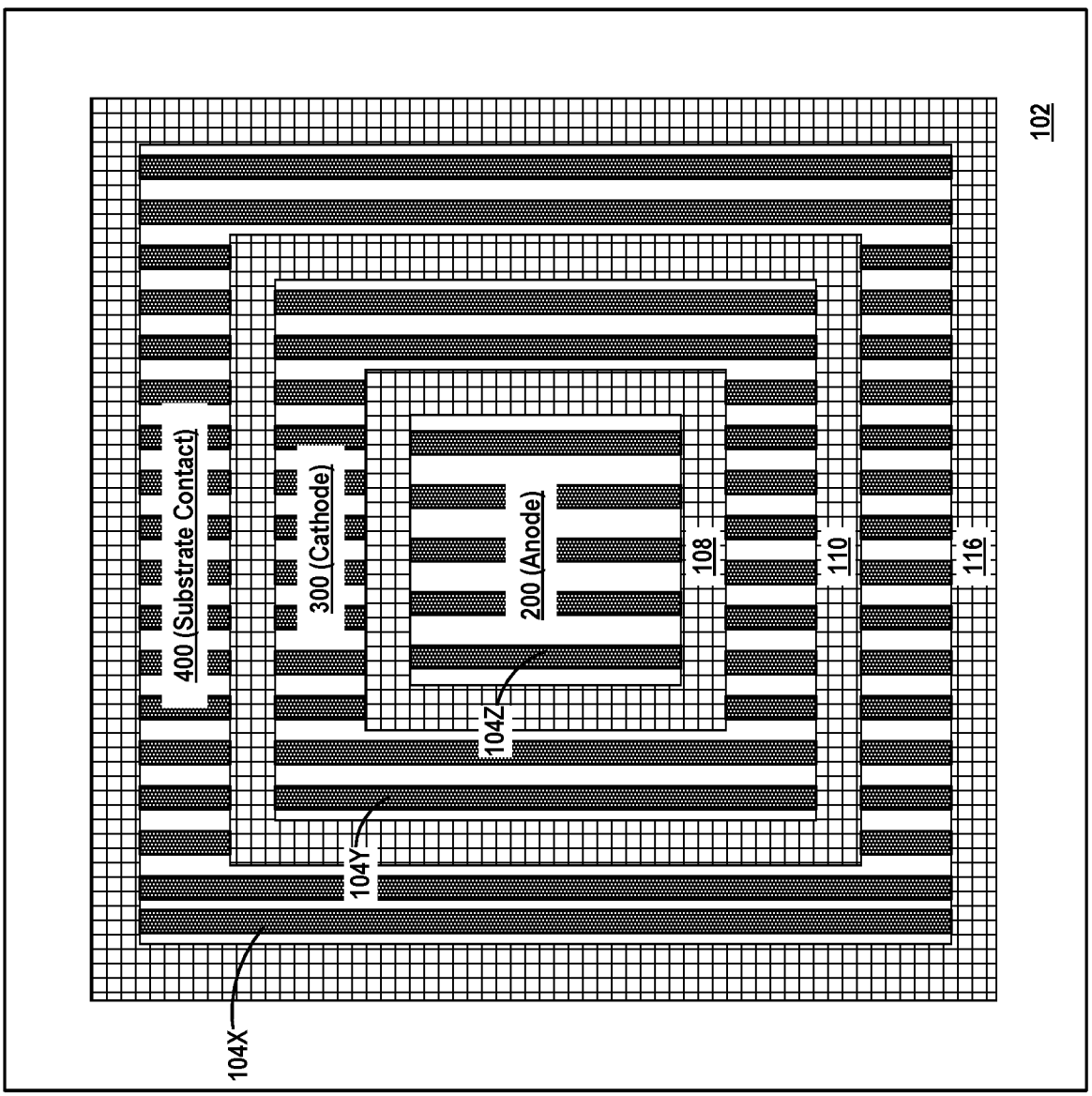

FIG. 3 is a simplistic plan view of the Schottky diode 100 after the formation of the fins 104 (depicted as dark lines) in the anode region 200, the cathode region 300 and the substrate contact region 400 using a much smaller scale for the width of the fins 104. The number of fins 104 shown in FIG. 3 in each of the anode region 200, the cathode region 300 and the substrate contact region 400 does not agree with the number of fins 104 shown in the cross-sectional views (e.g., FIG. 2) of the Schottky diode 100 herein. Moreover, no attempt has been made in FIG. 3 to show the inner well region 114 and the counter-doped outer well region 112 formed in the substrate 102. The isolation structures 108, 110 and 116 are also depicted in FIG. 3.

Returning to FIG. 2, after formation of the fins 104, a patterned etch mask (not shown), e.g., a patterned layer of photoresist was formed above the substrate 102. This patterned etch mask exposes portions of the substrate 102 where it is desired to form the isolation structures 108, 110 and 116. Thereafter, an etching process was performed to form trenches 115 in the substrate 102 where the isolation structures 108, 110 and 116 will be formed, and the patterned etch mask was removed. At that point, in one illustrative embodiment, a layer of HDP oxide was blanket-deposited on the Schottky diode 100 so as to overfill the spaces between the fins 104 and to fill the trenches 115. Next, a CMP and or etch-back process operation was performed to planarize the upper surface of the HDP oxide layer. In some cases, this planarization process also removes the patterned fin-formation etch mask (not shown) and thereby exposes the upper surface 104A of the fins 104. Thereafter, a timed, recess etching process was performed to remove portions of the HDP oxide layer until such time as the HDP oxide material remains only in the trenches 115 thereby forming the isolation structures 108, 110 and 116.

Figure 4:
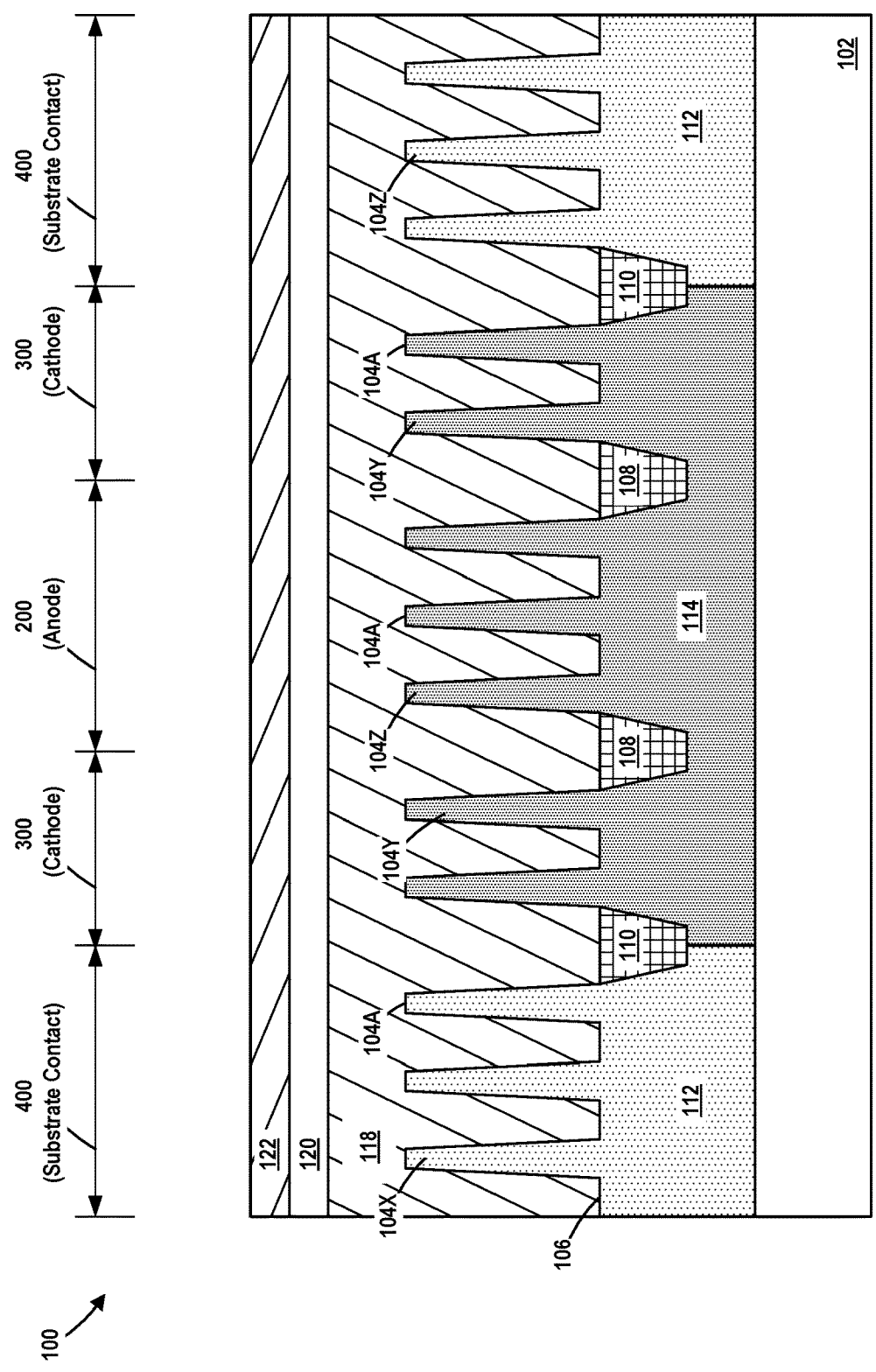

FIG. 4 depicts the Schottky diode 100 after several process operations were performed. First, a layer of insulating material 118 was formed so as to over-fill the trenches 106 between the fins 104. The layer of insulating material 118 may be comprised of a variety of materials, for example, a TEOS-based silicon dioxide, a HARP oxide, a flowable oxide, a low-k material, etc., and it may be formed to any desired thickness. Next, another layer of insulating material 120 was formed on the layer of insulating material 118. The layer of insulating material 120 may be comprised of a variety of materials, for example, silicon dioxide, and it may be formed to any desired thickness (e.g., 10-100 nm). In one illustrative example, the layer of insulating material 120 may be relatively thin, e.g., 15-25 nm. Thereafter, another layer of insulating material 122 was formed on the layer of insulating material 120. The layer of insulating material 22 may be comprised of a variety of materials, for example, silicon nitride, and it may be formed to any desired thickness. In one illustrative example, the layer of insulating material 122 may be relatively thin, e.g., 25-35 nm.

Figure 5:
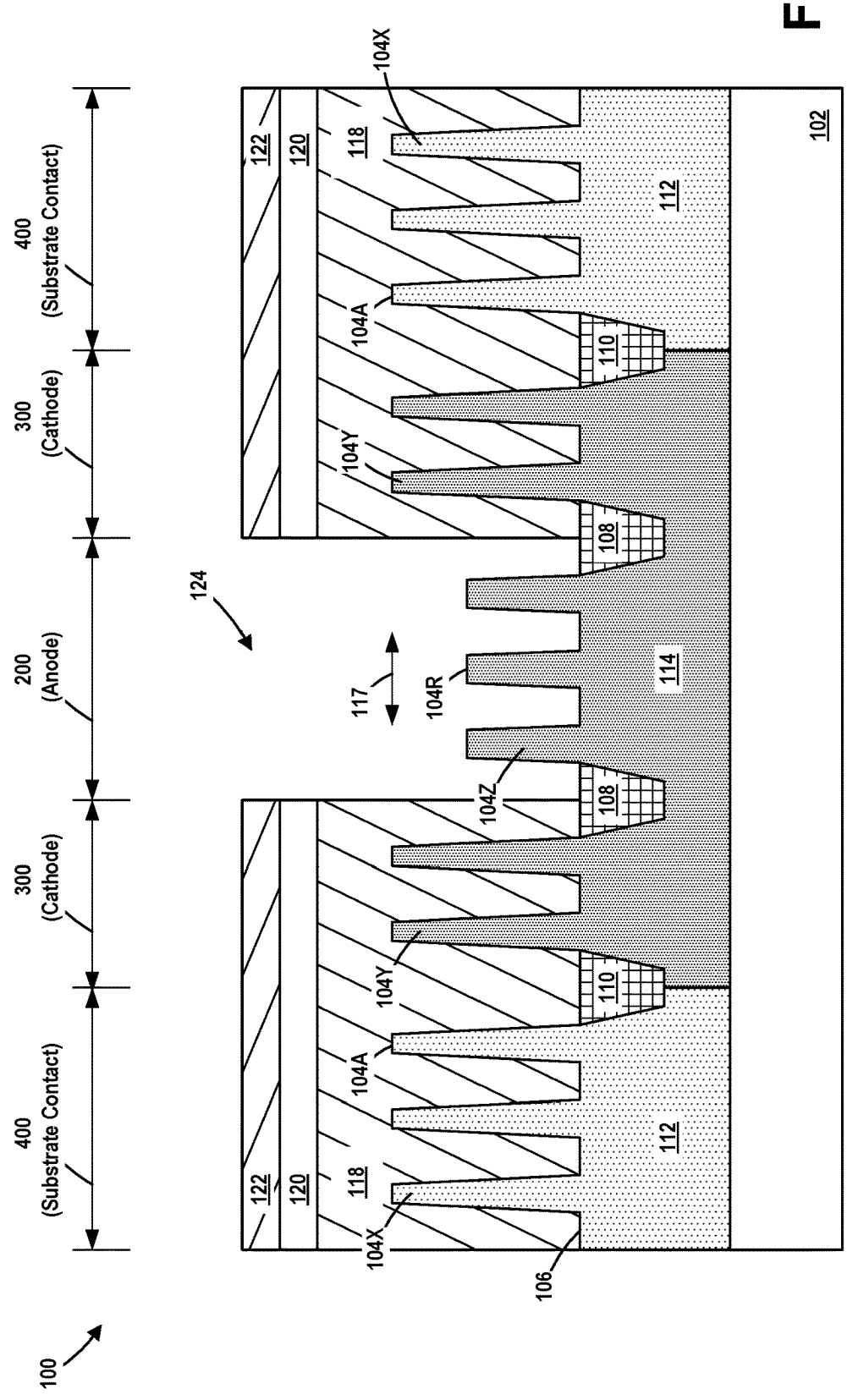

FIG. 5 depicts the Schottky diode 100 after several process operations were performed. First, a patterned etch mask (not shown), e.g. a patterned layer of photoresist, was formed above the layer of insulating material 122. This patterned etch mask contains an opening that corresponds to the size and location of the anode region 200. Thereafter, one or more etching processes were performed to remove portions of the layers of insulating material 122, 120 and 118 located above the anode region 200, thereby forming an opening 124 that exposes the fins 104Z in the anode region 200. The patterned etch mask may not remain in position or intact throughout the removal of all of the layers of insulating material 122, 120 and 118. Note that the isolations structure 108 may not be substantially attacked during the removal of the layer of insulating material 118, e.g., when the layer of insulating material 118 is a TEOS-based oxide, and the isolation structure 108 comprises an HDP oxide.

Also note that, during the etching of the layer of insulating material 118, a portion of the initial vertical height of the fins 104Z in the anode region will be consumed, i.e., the fins 104Z will be recessed. As a result, at the completion of all of the etching processes, the recessed fins 104Z have a recessed upper surface 104R and the recessed fins 104Z are shorter than the fins 104X in the substrate contact region 400 and the fins 104Y in the cathode region 300. In one illustrative example, about 30-50 nm of the original height of the fins 104Z may be removed when the fins 104Z are recessed. All of the fins 104 have an axial length (or long axis), i.e., they extend into and out of the plane of the drawing page in FIG. 5. The double arrow 117 in FIG. 5 indicates a direction that is transverse to the long axis of the fins 104. It should also be noted that the width (in the direction 117) of the recessed upper surface 104R of the recessed fins 104Z in the anode region 200 is greater than the width of the original upper surface 104A of the fins 104. In one illustrative example, the width of the recessed upper surface 104R may be about 10-20 nm wider than the original upper surface 104A of the fins 104. If not previously removed, the patterned etch mask was then removed.

Figure 6:
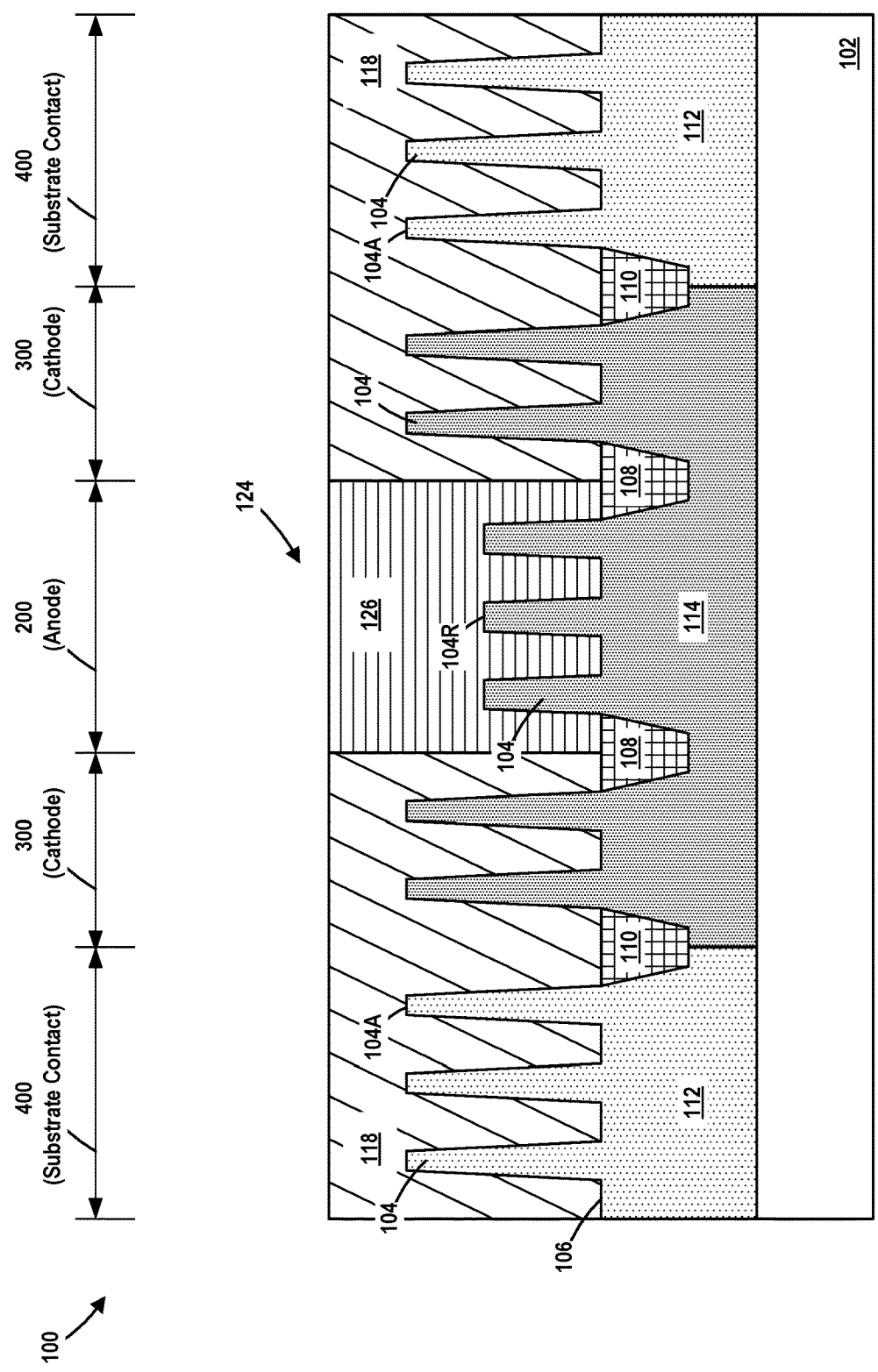

FIG. 6 depicts the Schottky diode 100 after several process operations were performed. First, a masking material 126, e.g., OPL, was formed so at to overfill the opening 124 and thereby cover the anode region 200. Next, one or more CMP and or etch-back processes were performed to remove portions of the masking material 126 positioned outside of the opening 124 and to remove the layers of insulating material 122 and 120.

Figure 7:
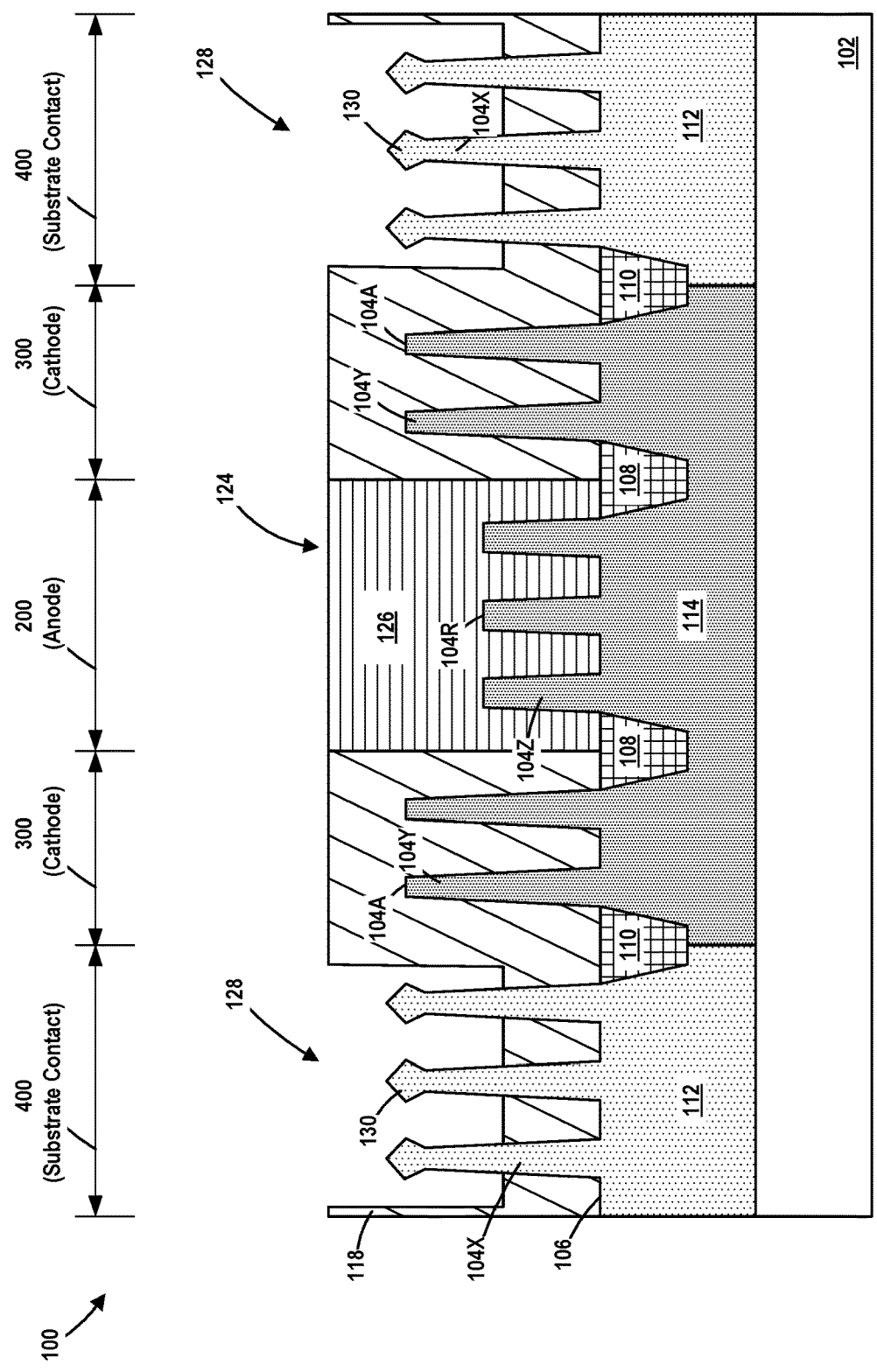

FIG. 7 depicts the Schottky diode 100 after several process operations were performed. First, a patterned etch mask (not shown), e.g., a patterned layer of photoresist, was formed above the layer of insulating material 118. Thereafter, an etching process was performed to form an opening 128 in the layer of insulating material 118 that exposes portions of the fins 104X in the substrate contact region 400. As noted above, in the illustrative example depicted herein, the fins 104X in the substrate contact region 400 contain P-type dopant since the fins 104X were formed in the P-doped counter-doped outer well region 112. Accordingly, after the fins 104X were exposed, a P+ ion implantation process was performed to form a P+ implant region in at least a portion of the vertical height of the fins 104X. No attempt has been made to show this P+ implant region in the fins 104X. In one illustrative embodiment, the P+ region may extend for substantially the entire height of the fins 104X, i.e., from the upper surface 104A (see FIG. 6) to the bottom of the fin-formation trenches 106. Thereafter, an illustrative diamond-shaped region of P+ doped epitaxial semiconductor material 130 was formed on the fins 104X in the substrate contact region 400 by performing known epitaxial growth processing operations. The P+ doped epitaxial semiconductor material 130 may be comprised of a variety of different materials, e.g., silicon germanium.

Figure 8:
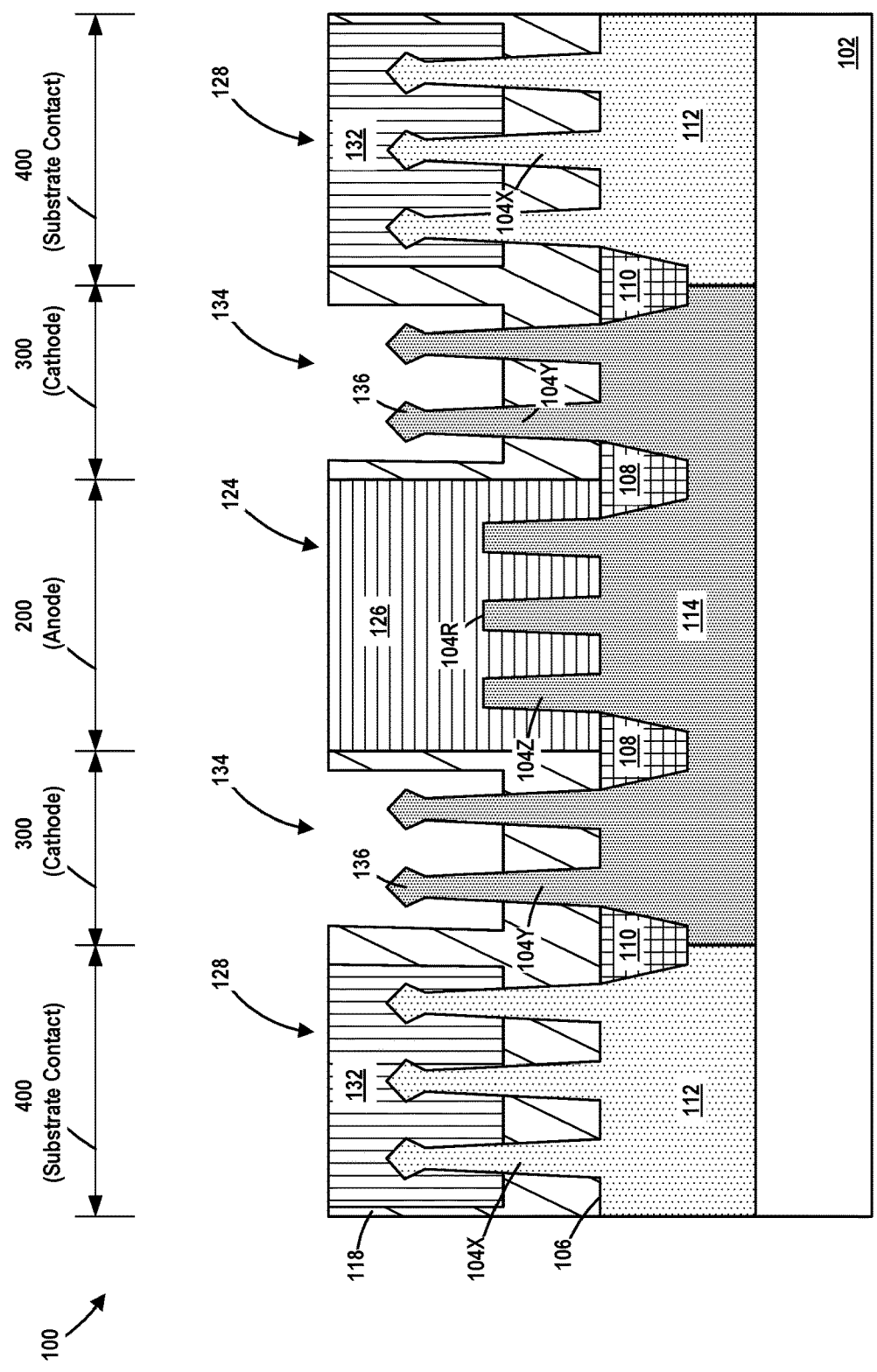

FIG. 8 depicts the Schottky diode 100 after several process operations were performed. First, a masking material 132, e.g., OPL, was formed so as to overfill the opening 128 and thereby cover the substrate contact region 400. Next, one or more CMP processes were performed to remove portions of the masking material 132 positioned outside of the opening 128. Next, a patterned etch mask (not shown), e.g., a patterned layer of photoresist, was formed above the layer of insulating material 118. Thereafter, an etching process was performed to form an opening 134 in the layer of insulating material 118 that exposes portions of the fins 104Y in the cathode region 300. As noted above, in the illustrative example depicted herein, the fins 104Y in the cathode region 300 contain N-type dopant since the fins 104Y were formed in the N-doped inner well region 114. Accordingly, after the fins 104Y were exposed, an N+ ion implantation process was performed to form an N+ implant region in at least a portion of the vertical height of the fins 104Y. No attempt has been made to show this N+ implant region in the fins 104Y. In one illustrative embodiment, the N+ region may extend for substantially the entire height of the fins 104Y, i.e., from the upper surface 104A (see FIG. 6) to the bottom of the fin-formation trenches 106. Thereafter, an illustrative diamond-shaped region of N+ doped epitaxial semiconductor material 136 was formed on the fins 104Y in the cathode region 300 by performing known epitaxial growth processing operations. The N+ doped epitaxial semiconductor material 136 may be comprised of a variety of different materials, e.g., silicon. Note that, in the illustrative process flow described above in connection with FIGS. 7 and 8, the fins 104X in the substrate contact region 400 were processed before the fins 104Y in the cathode region 300. However, if desired, the order of processing could be reversed.

Figure 9:
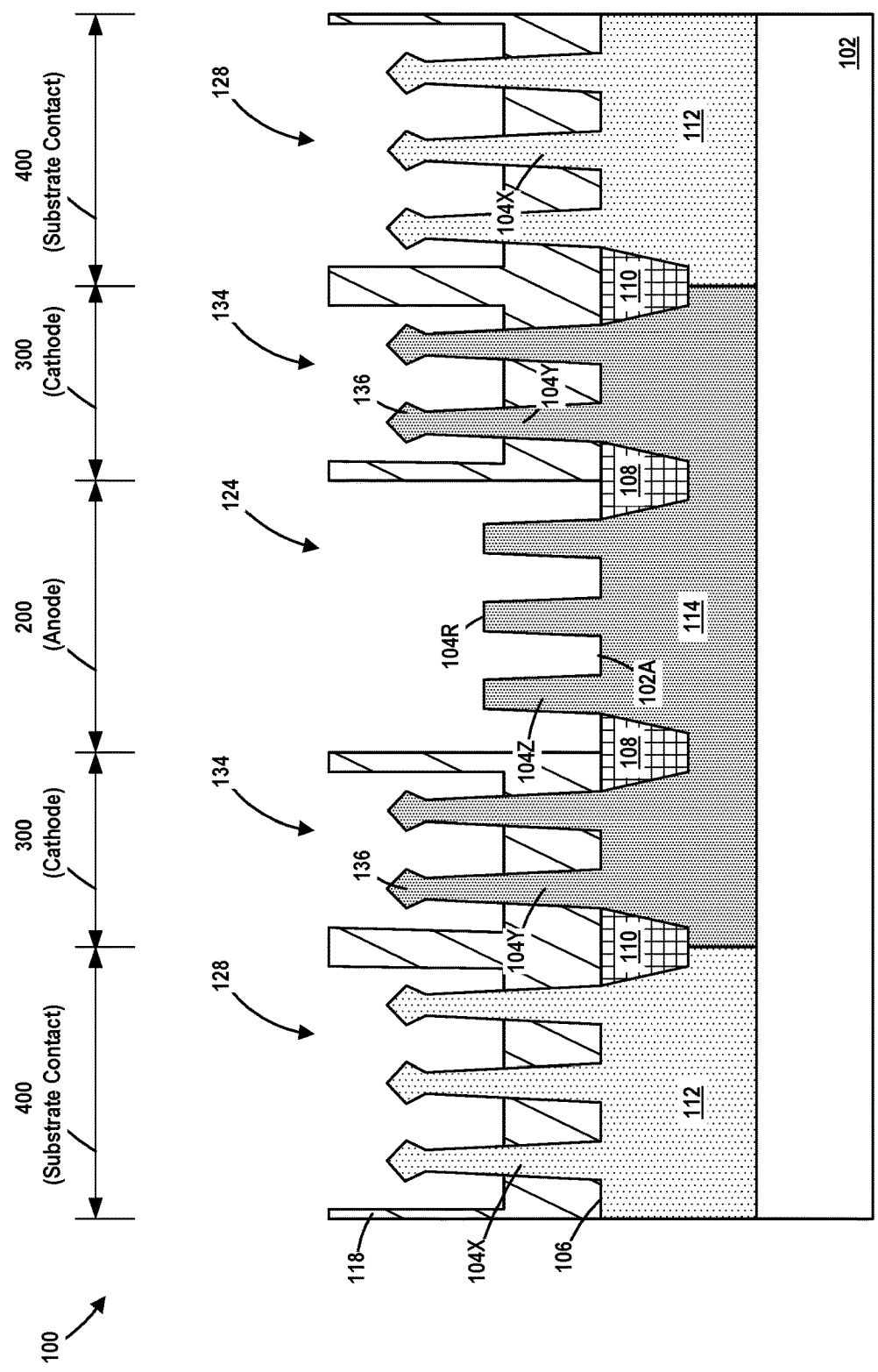

FIG. 9 depicts the product after the masking materials 126 and 132 were removed. Note that this process operation exposes the fins 104Z in the anode region 200 and the upper surface 102A of the substrate 102 in the anode region 200. Note that the surface 102A (at the bottom of the fin formation trenches 106) is being referred to as the upper surface of the substrate 102 even though the fins 104 are formed in the substrate. At this point, a cleaning etch process may be performed to remove all unwanted materials, e.g., native oxides, from the exposed portions of the fins 104 and from the upper surface 102A of the substrate in the anode region 200.

Figure 10:
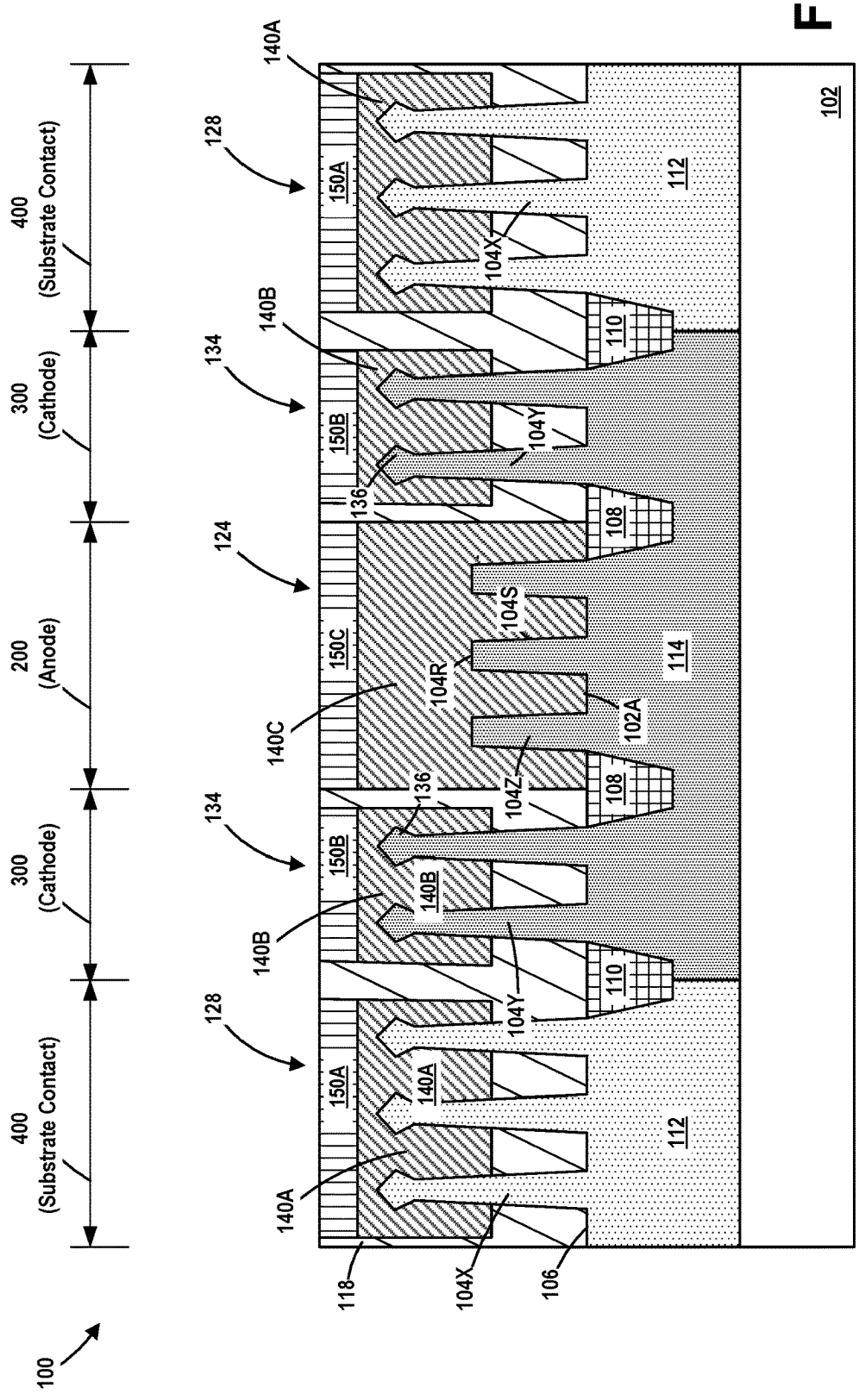

FIG. 10 depicts the Schottky diode 100 after several process operations were performed. First, conductive structures 140A, 140B and 140C (collectively referenced using the numeral 140) were formed in the openings 128, 134 and 124, respectively. Thereafter, insulating cap layers 150A, 150B and 150C (collectively referenced using the numeral 150) were formed on the conductive structures 140A, 140B and 140C, respectively. The conductive structures 140 may be comprised of any metal-containing material, e.g., tungsten, a metal silicide (e.g., TiSi), and they may be formed by performing known manufacturing techniques. In one illustrative example, the conductive structures 140 may be made of the same conductive materials as are used to form source/drain contact structures (e.g., trench silicide structures) that are typically formed on the portions of fins (not shown) in the source/drain regions of various FinFET transistor devices (not shown) that are formed elsewhere on the substrate 102.

The conductive structures 140 may be formed by depositing the conductive material(s) of the contact structures 140 in the openings 128, 134 and 124 and thereafter recessing those conductive materials to make room for the insulating cap layers 150. Thereafter, the material for the cap layers 150, e.g., silicon nitride, may be deposited on the substrate and a CMP process operation may be performed to remove portions of the cap layer material positioned above the upper surface of the layer of insulating material 118. At that point, one or more openings (not shown) may be formed in each of the cap layers 150 so that a conductive contact structure (not shown) may be formed to conductively contact each of the conductive structures 140.

As will be recognized by those skilled in the art, a Schottky diode 100 is formed in the anode region 200 by the engagement of the conductive structure 140C with at least the recessed upper surface 104R of the recessed fins 104Z (made of semiconductor material). In the depicted example, the wider recessed upper surface 104R of the recessed fins 104Z provides sufficient contact area for the formation of the Schottky diode. In some cases, the conductive structure 140C may also engage at least a portion of the sidewall surfaces 104S of the recessed fins 104Z and perhaps a portion of the upper surface 102A of the semiconductor substrate 102. In the depicted example, the conductive structure 140C engages substantially all of the upper surface 104R of the recessed fins 104Z, substantially the entirety of the sidewalls 104S of the recessed fins 104Z and substantially the entire upper surface 102A of the substrate 102 within the anode region 200. Moreover, the method of forming the Schottky diode 100 is highly compatible and readily incorporated into process flows that are used to form FinFET devices on other portions of the substrate 102. In one illustrative example, during operation of the Schottky diode 100, at least the entire upper surface 104R of the recessed fins 104Z in the anode region 200 are used in the on-state of the device. Also, due to the wider width of the upper surface 104R of the recessed fins 104Z as compared to the width of the upper surface 104A of the fins 104X, 104Y in the substrate contact region 400 and the cathode region 300, respectively, the resistance to current flow in the anode region 300 is less than the resistance to current flow in the substrate contact region 400 and the cathode region 300.

Figure 11:
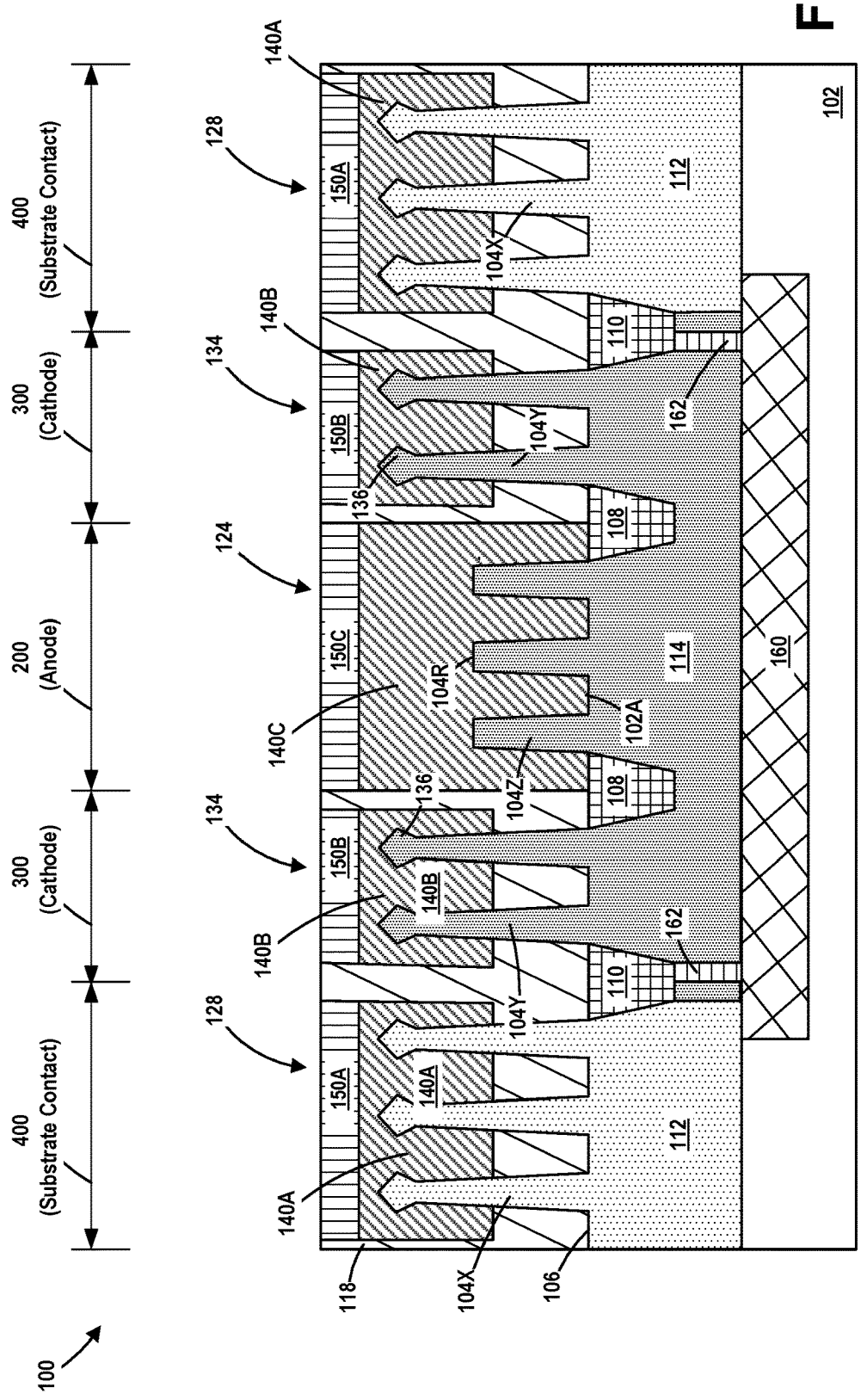

FIG. 11 depicts an embodiment of the Schottky diode 100 that may be employed in high voltage applications, e.g., in applications where the voltage levels may be about 0.8-20 volts based upon current-day technology. Again, the following description is based upon the assumption that the Schottky diode 100 is an N-type device. In this embodiment, a deep well region 160 is formed in the substrate 102 under the inner well region 114 and a counter-doped ring well 162 is formed below the isolation structure 110 within the inner well region 114. The counter-doped ring well 162 extends down to the deep well region 160.

The deep well region 160 and the counter-doped ring well 162 may be formed at the same time as the inner well region 114 and the outer well region 112. The dopant concentration, location of peak dopant concentration and the overall vertical depth of the deep well region 160 and the counter-doped ring well 162 may all vary depending upon the particular application. In general, the deep well region 160 will be doped with the same dopant type as that of the inner well region 114, and the deep well region 160 may have a greater or lesser concentration of dopant atoms than are present in the inner well region 114. The formation of the counter-doped ring well 162 within the inner well region 114 creates an impediment to current flowing from the inner well region 114 to the outer well region 112 under the isolation structure 110. This feature minimizes the side (or lateral) leakage currents by spreading out larger depletion width.

In the case where the Schottky diode 100 is an N-type device, the deep well region 160 will be doped with an N-type dopant (e.g., arsenic, phosphorous, etc.) and the counter-doped ring well 162 will be doped with a P-type dopant (e.g., boron, boron difluoride, etc.). In the case where the Schottky diode 100 is a P-type device, the deep well region 160 will be doped with a P-type dopant (e.g., boron, boron difluoride, etc.) and the counter-doped ring well 162 will be doped with an N-type dopant (e.g., arsenic, phosphorous, etc.).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A Schottky diode, comprising:
a semiconductor substrate;
an anode region comprising a plurality of first fins formed in said semiconductor substrate, wherein an upper surface of the semiconductor substrate is exposed within said anode region and wherein the plurality of first fins have a first vertical height and sidewall surfaces;
a cathode region comprising a plurality of second fins formed in said semiconductor substrate, wherein the plurality of second fins have a second vertical height that is greater than the first vertical height;
a conductive structure that contacts and engages at least an upper surface of the plurality of first fins in the anode region and at least a portion of the upper surface of the semiconductor substrate within the anode region;
an inner doped well region in the semiconductor substrate below the anode region and the cathode region, the inner doped well region comprising dopant material of a first type; and
a counter-doped outer well region in the semiconductor substrate below a substrate contact region and around the inner doped well region, the counter-doped outer well region comprising dopant material of a second type that is opposite the first type, the substrate contact region including a plurality of third fins.

2. The Schottky diode of claim 1, where each of the plurality of first fins has a first upper surface and each of the plurality of second fins has a second upper surface, wherein a lateral width of the first upper surface is greater than a lateral width of the second upper surface.

3. The Schottky diode of claim 1, wherein the conductive structure contacts and engages at least a portion of the sidewall surfaces of the plurality of first fins.

4. The Schottky diode of claim 1, wherein the conductive structure contacts and engages the entirety of the sidewall surfaces of the plurality of first fins.

5. The Schottky diode of claim 1, wherein the Schottky diode is an N-type diode and wherein the inner doped well region is doped with an N-type dopant, the counter-doped outer well region is doped with a P-type dopant and the semiconductor substrate is doped with a P-type dopant.

6. The Schottky diode of claim 1, wherein the number of first fins and the number of second fins is different.

7. A Schottky diode, comprising:
a semiconductor substrate;
an anode region comprising a plurality of first fins formed in the semiconductor substrate, wherein the plurality of first fins have a first vertical height and a first upper surface and wherein an upper surface of the semiconductor substrate is exposed within the anode region;
a cathode region comprising a plurality of second fins formed in the semiconductor substrate, wherein the plurality of second fins have a second vertical height and a second upper surface, wherein the second vertical height is greater than the first vertical height and wherein a lateral width of the first upper surface is greater than a lateral width of the second upper surface;
a substrate contact region comprising a plurality of third fins formed in the semiconductor substrate;
an inner doped well region in the semiconductor substrate below the anode region and the cathode region, the inner doped well region comprising dopant material of a first type;
a counter-doped outer well region in the semiconductor substrate below the substrate contact region and around the inner doped well region, the counter-doped outer well region comprising dopant material of a second type that is opposite the first type; and
a conductive structure that conductively contacts at least an upper surface of the plurality of first fins in the anode region.

8. The Schottky diode of claim 7, wherein each of the plurality of first fins comprises sidewall surfaces and wherein the conductive structure contacts and engages at least a portion of the sidewall surfaces of the plurality of first fins.

9. The Schottky diode of claim 7, wherein each of the plurality of first fins comprises sidewall surfaces and wherein the conductive structure contacts and engages the entirety of the sidewall surfaces of the plurality of first fins.

10. The Schottky diode of claim 7, wherein the conductive structure contacts and engages at least a portion of the upper surface of the semiconductor substrate within the anode region.

11. The Schottky diode of claim 9, wherein the conductive structure contacts and engages at least a portion of the upper surface of the semiconductor substrate within the anode region.

12. A Schottky diode, comprising:

a semiconductor substrate;

an anode region comprising a plurality of first fins formed in said semiconductor substrate, wherein an upper surface of the semiconductor substrate is exposed within said anode region and wherein the plurality of first fins have a first vertical height;

a cathode region comprising a plurality of second fins formed in said semiconductor substrate, wherein the plurality of second fins have a second vertical height that is greater than the first vertical height;

a conductive structure that contacts and engages at least an upper surface of the plurality of first fins in the anode region;

a substrate contact region comprising a plurality of third fins formed in the semiconductor substrate;

an inner doped well region in the semiconductor substrate below the anode region and the cathode region, the inner doped well region comprising dopant material of a first type; and a counter-doped outer well region in the semiconductor substrate below the substrate contact region and around the inner doped well region, the counter-doped outer well region comprising dopant material of a second type that is opposite the first type.

13. The Schottky diode of claim 12, where each of the plurality of first fins has a first upper surface and each of the plurality of second fins has a second upper surface, wherein a lateral width of the first upper surface is greater than a lateral width of the second upper surface.

14. The Schottky diode of claim 12, wherein each of the plurality of first fins comprises sidewall surfaces and wherein the conductive structure contacts and engages at least a portion of the sidewall surfaces of the plurality of first fins.

15. The Schottky diode of claim 12, wherein each of the plurality of first fins comprises sidewall surfaces and wherein the conductive structure contacts and engages the entirety of the sidewall surfaces of the plurality of first fins.

16. The Schottky diode of claim 12, wherein the Schottky diode is an N-type diode and wherein the inner doped well region is doped with an N-type dopant, the counter-doped outer well region is doped with a P-type dopant and the semiconductor substrate is doped with a P-type dopant.

17. The Schottky diode of claim 12, wherein the number of first fins and the number of second fins is different.

* * * * *